United States Patent [19]

Lehmann et al.

[11] Patent Number: 4,654,605
[45] Date of Patent: Mar. 31, 1987

[54] SYSTEM FOR SHIFT REGISTER CLOCKING OF ANALOG STORAGE CELLS

[75] Inventors: Klaus Lehmann, Mühltal; Karl-Heinz Müller, Gräfenhausen, both of Fed. Rep. of Germany

[73] Assignee: Robert Bosch GmbH, Stuttgart, Fed. Rep. of Germany

[21] Appl. No.: 801,487

[22] Filed: Nov. 25, 1985

[30] Foreign Application Priority Data

Nov. 29, 1984 [DE] Fed. Rep. of Germany ....... 3443424

[51] Int. Cl.$^4$ .............................................. H03B 5/08
[52] U.S. Cl. ................. 331/55; 331/117 R; 331/167; 307/269; 328/73
[58] Field of Search ...................... 331/55, 117 R, 167; 307/269; 328/72, 73

[56] References Cited

U.S. PATENT DOCUMENTS 4,158,181 6/1979 Balopole .................... 331/117 R X

OTHER PUBLICATIONS

Michael F. Tompsett and Edward J. Zimany, Jr., "Use of Charge-Coupled Devices for Delaying Analog Signals", Apr. 1973, IEEE Journal of Solid-State Circuits.

Primary Examiner—Eugene R. LaRoche
Assistant Examiner—Robert J. Pascal
Attorney, Agent, or Firm—Frishauf, Holtz, Goodman & Woodward

[57] ABSTRACT

A resonant circuit which includes the input capacitance of the clock pulse inputs of a shift register (10) is pulsed by a sinusoidal wave at voltage peaks of the wave by an oscillator delivering barely enough energy to overcome the damping of the resonant circuit. The oscillator may be crystal controlled and, instead of having a single ended output for delivering energy only on peaks of one polarity, may be in push-pull form reinforcing oscillation peaks of both polarities. This circuit is easily combined with arrangements for switching oscillator frequency from one value to another and/or arrangements for interrupting the clock pulse output for timed intervals after each loading or unloading of the shift register. The loss power dissipation is reduced to about 6% of the loss power dissipation of a square pulse drive for the clocking of the same shift register. The low loss drive for shift register advancement is applicable to a variety of analog stepped storage and delay devices, such as charge coupled devices and "bucket brigade" devices.

10 Claims, 9 Drawing Figures

SYSTEM FOR SHIFT REGISTER CLOCKING OF ANALOG STORAGE CELLS

This invention concerns the stepping or clocking of analog storage cells in a shift register configuration as, for example, shift registers of the CCD, BBD, CTD kinds and the like.

These devices are known to be used for processing optical signals, for example as line or surface sensors for television cameras or other electronic cameras, or for electrical signal processing, for example in delay lines or vertical aperture correction, for signal dropout compensation in magnetic picture signal recording, time transformation, and so on. The storing or delaying of television signals in such cases takes place by means of a multiplicity of analog storage cells which need to be addressed in a suitable way. For such addressing, the so-called shift register operation is used, i.e., the information stored in the storage cells is advanced by one cell position with each shift clocking pulse that is supplied to the apparatus. For addressing purposes, a particular pulse flank can be associated to a particular storage location of information. The storage cells must be clocked long enough (activated by shift stepping pulses) until the desired information becomes available at the output of the string of analog storage cells.

For example, for activating a shift register consisting of analog storage cells, there are usually provided two steep-flanked rectangular pulse trains as shift clocking pulses. Since the shift clocking inputs of a shift register have relatively large input capacitances (for example, in the case 910 storage cells, about 200 pf), shift pulse drivers of considerable power are required and, as is known, their power dissipation in push-pull operation, at a stepping frequency of 14.3 MHz and a pulse voltage of 15 V peak to peak, amounts to at least 0.64 watt. Since in television equipment, such as a television camera, television monitor, magnetic recording system or television film scanner, a multiplicity of such analog storage devices are installed or incorporated, the power dissipation accumulates correspondingly and along with it likewise the output of disturbing radiation.

SUMMARY OF THE INVENTION

It is an object of the present invention to provide substantial reduction of the drive power losses in an analog cell shift register of the kind above-described.

Briefly, this result is obtained by supplying shift clocking signals in sinusoidal forms to the analog storage cells. This has the advantage that the power dissipation of each clocking circuit is reduced by about the factor 17.

It is practical to generate these sinusoidal shift stepping signals with a parallel resonant circuit composed of the input capacitances of the analog storage cells and a coil connected to their clock signal connection, especially with center tapping. Preferably, the resonant circuit is activated by a pulse generator in such a way that its damping is compensated. It is also preferable for the pulse generator to consist principally of a freely oscillating "single-ended" or push-pull pulse oscillator.

Quartz crystal control can advantageously be used for the pulse generator. It is also convenient in particular cases to connect one or more switchable capacitances in parallel to the input capacitances of the shift register. Similarly, it can be convenient to provide for connecting an additional coil in parallel to the coil previously mentioned and to switch one or the other coil into circuit according to the desired clock frequency.

A further feature that can be provided is to provide electronic switches respectively between coil parts and the center tap which are opened only at the instant of signal maximum. In this case, it can further be provided that electronic switches are connected both in the parallel path of the additional capacitances above-mentioned and between the coil halves and the center tap, these switches to be opened or closed at the instant of a signal peak.

BRIEF DESCRIPTION OF THE DRAWINGS

The invention is further described by way of illustrative examples with reference to the annexed drawings, in which.

DESCRIPTION OF THE ILLUSTRATED EMBODIMENTS

Figure 1:
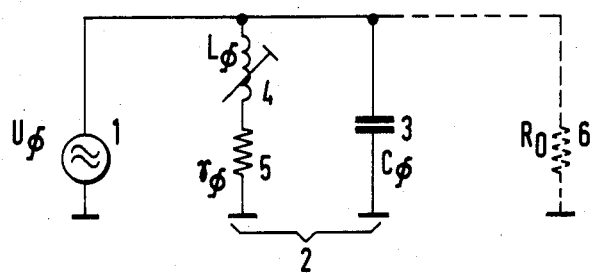
FIG. 1 is an equivalent circuit illustrating the characteristics of sinusoidal drive for the performance of the clocking function for a shift register.

The equivalent circuit of FIG. 1 shows a source 1 of clock pulses used for advancing a shift register, which source provides a sinusoidal voltage $U_\phi$ of the peak-to-peak voltage of 15 volts at a stepping frequency $f_a$ of 14.3 MHz. The source 1 is connected to a parallel-resonant circuit 2. This resonant circuit 2 is composed of the total input capacitance 3 of the shift clocking input of the shift register, having a value $C_\phi$ of, for example, 200 pF, and a coil 4 of an inductance $L_\phi$ of 0.2 $\mu$H and a loss resistance 5 having a value $r_\phi$ of, for example, 4 ohms, connected to the shift register clocking inputs. For calculating the loss power $N_V$ of this resonsant circuit 2, the corresponding parallel resistance 6 ($R_0 = 780$ ohms) can be put in the circuit instead of the series resistance $r_\phi$. From the assumed values, a loss power of $N_V = U_{100}{}^2 - 8R_0$ of 36 mW.

The parallel resonant circuit 2 has its damping continuously counteracted by a driver circuit which corresponds to the signal source 1 in the equivalent circuit, in order to compensate out the losses produced by the resistance 5 or the resistance 6. The drive circuit operates by boosting the sinusoidal oscillation of the resonant circuit 2 every time the maximum voltage is reached. By this undamping, there results a loss power of $N_{tr}=(\Delta U_\phi)^2 \cdot f_a \cdot C_\phi$ which in the present example has the value of 1.8 mW. By driving sinusoidal signals, an aggregate loss power $N_\phi$ is dissipated which has a value derived as follows:

$$N_\phi = N_V + N_{tr} = 36 \text{ } mW + 1.8 \text{ } mW = 37.8 \text{ } mW,$$

which corresponds to a diminution of the loss power by about the factor 17 compared with the lost power in the case of drive by rectangular pulses ($N_\phi \sim 640$ mW).

Figure 2:
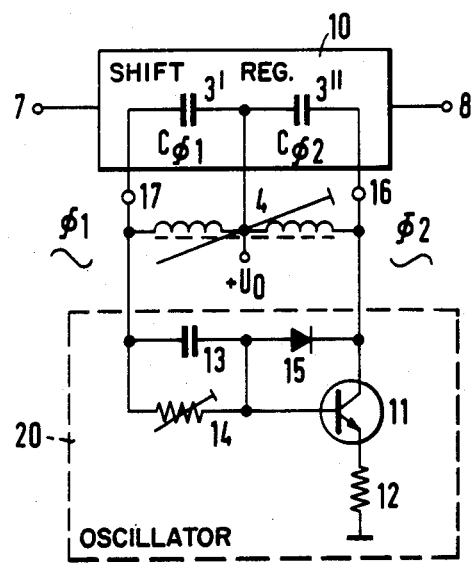
FIG. 2 is a circuit diagram of a clocking drive circuit for a shift register according to the invention with single-ended antidamping of the resonant circuit with a free running oscillator.

FIG. 2 shows a circuit, itself already known, of a free-running or self-excited oscillator 20 which delivers a single boost pulse per cycle of oscillation of the resonant circuit, in this case undamping the parallel circuit only during the negative voltage peaks of the sinusoidal oscillation. The oscillator 20 consists essentially of a transistor 11 having its collector connected to one end of the resonant circuit coil 4 and having its emitter connected through a resistance 12 to a reference potential, and also a capacitor 13 connected between the base of the transistor 11 and the other end of the coil 4. The oscillation amplitude can be adjusted by means of the variable resistance 14 connected in parallel with the capacitor 13.

The two ends of the coil 4 are connected, through the two input terminals 16 and 17 for the shift register clocking, to the input capacitances 3' and 3" of the shift register 10, which is shown simply as a circuit block with terminals, except for those input capacitances. The shift register 10 has an input terminal 7 to which a video signal is applied for storage or for delay, and has an output terminal 8 where the delayed video signal is made available. The center tap of the coil 4 is connected on one hand to a DC voltage source $+U_0$ and on the other hand, with the common connection of the two input capacitances 3' and 3", so that there are applied to the clock pulse input terminals 16 and 17, respectively, two shift clocking signals $\phi_1$ and $\phi_2$ which are of opposite phase.

A diode 15 connected between the collector and base of the transistor 11 limits the drive current by becoming inductive when the sinusoidal clock signals $\phi_1$ and $\phi_2$ exceed the permissible limit voltage of 15 voltage at peak to peak. The oscillation amplitude of these clock signals $\phi_1$ and $\phi_2$ are accordingly relatively constant within the working range that is available. The diode 15 effectively suppresses cross-talk between the video signals issuing from the storage cells of the shift register 10, which otherwise would affecting the shift clocking signal, and impress parts of the picture content on the shift clocking pulses and transmit them back to the storage cells at other locations.

Figure 3:
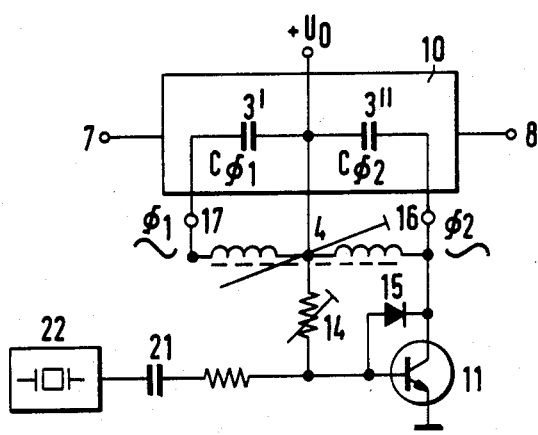
FIG. 3 is a modification of the circuit of FIG. 2 for incorporation of an external crystal controlled oscillator.

The circuit according to FIG. 3 is distinguished from that of FIG. 2 merely in that an external crystal controlled oscillator 22 is provided which is coupled to the circuit through the capacitor 21 and takes the place of the capacitor 13 of FIG. 2. Thus, quartz crystal control raises the constancy of the drive signal frequency, so that a precise delay time can be obtained.

Figure 4:
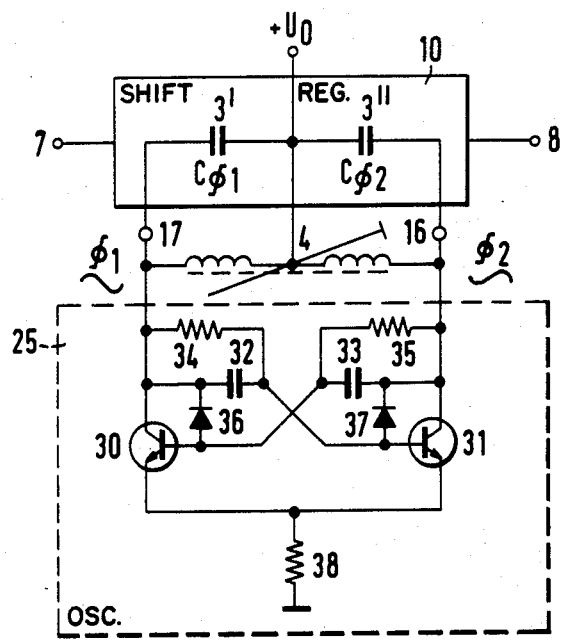
FIG. 4 is a circuit diagram of a clocking drive for a shift register according to the invention, with double-ended antidamping of the resonant circuit with a free running oscillator.

The circuit FIG. 4 has a free-running or self-excited push-pull oscillator 25, which makes possible double ended undamping of the resonant circuit, i.e., correcting both the positive and the negative peak values of the sinusoidal oscillations.

The push-pull oscillator 7 which, in a known manner consists of the transistors 30, 31, the capacitors 32, 33, the resistances 34, 35, the diodes 36, 37 and the common emitter resistance 38, supplies the shift clock signals $\phi_1$ and $\phi_2$ in opposite phases respectively through the two ends of the coil 4 which in turn are connected respectively through the terminals 16 and 17 with the capacitances 3' and 3". Here also, the center tap of the resonant circuit coil 4, as well as the common connection of the two input capacitances 3' and 3" are connected to a DC voltage source $+U_0$.

Figure 5:
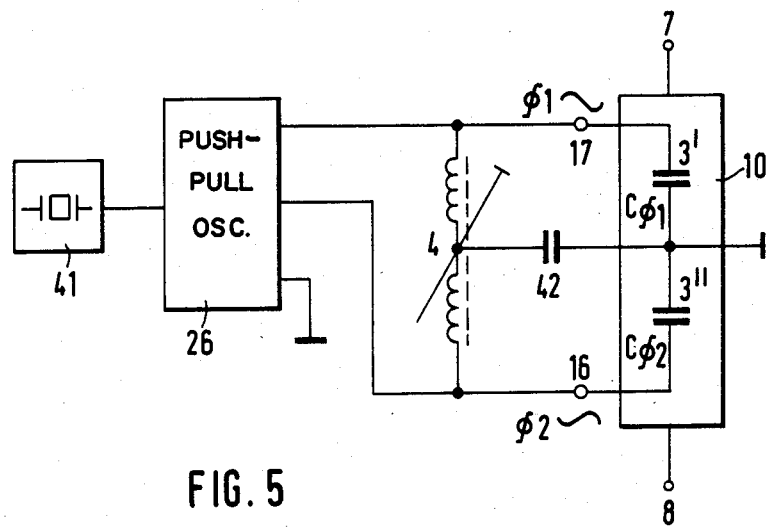
FIG. 5 is a modification of the circuit of FIG. 4 for incorporation of a crystal controlled oscillator.

A double-ended undamping of the resonant circuit can also be done by the circuit of FIG. 5. This circuit consists of a known push-pull circuit 26 which is driven by an external crystal control oscillator 41. The parallel resonant circuit 3,4 is so excited by the push-pull circuit 26, that the clocking signals $\phi_1$ and $\phi_2$ of opposite phases are provided as undamped oscillations respectively to the terminals 16 and 17, while the center tap of the coil 4 is held at a reference potential for purposes of alternating current by means of a capacitor 42.

Figure 6A:
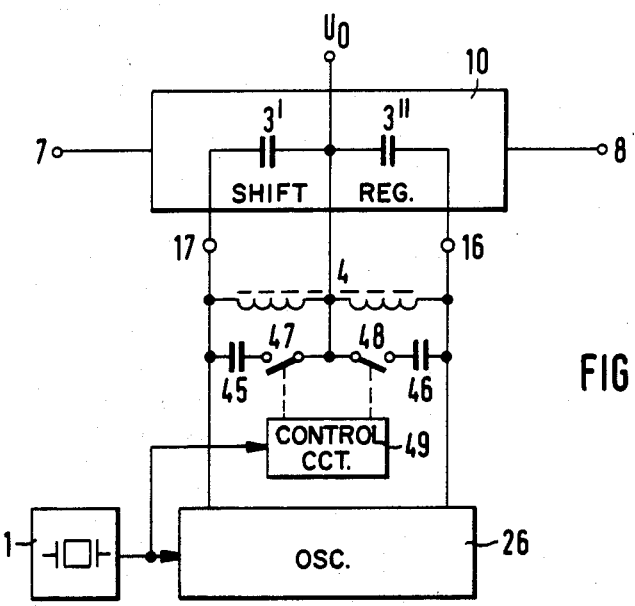
FIG. 6a is a modification of tahe circuit of FIG. 5 for provision of switching between two operating frequencies of the clocking signals.
Figure 6B:
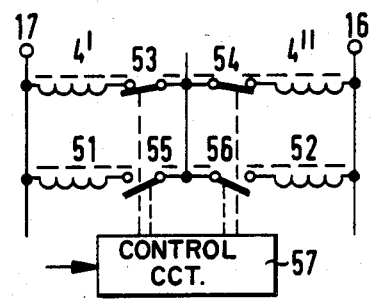
FIG. 6b is a circuit diagram of a variation of the frequency switching portion of the circuit of FIG. 6a, and FIGS. 7a and 7b respectively show other variations of the circuit of FIG. 6a for switching between clocking frequencies.

The circuits shown in FIGS. 6a and 6b for a shift clocking drive with the feature of changing the frequency of clocking the shift operation are useful, for example, for time transformation of analog video signal samples by using different frequencies for writing into the shift register 10 and for reading out of it.

In FIG. 6a capacitors 45 and 46 are provided which may be switched respectively by switches 47 and 48 for putting them respectively in parallel with the input capacitances 3' and 3" and disconnecting them therefrom at will. The switches 47 and 48 are controlled by a control circuit 49 which is synchronized by the crystal controlled oscillator 41 so as to open and close the switches 47 and 48 at appropriate instants. The resonant frequency can be changed by adding, into circuit, capacitances 45 and 46 respectively in parallel with the input capacitances 3' and 3", so that with control of the switches 47 and 48 in a known time pattern, a time transformation can be accomplished, for example, for performing the writing into the shift register more slowly compared to the reading out.

In the modification of the frequency switching illustrated in FIG. 6b, instead of the capacitor branch circuits according to FIG. 6a there are provided coil branch circuits respectively equipped with the two coil parts 51 and 52 for putting inductance respectively in parallel with the resonant circuit coil portions 4' and 4". Since the inductances of the coil parts 51 and 52 differ from those of the coil parts 4' and 4", by using switches 53 and 54 as well as switches 55 and 56 it is also possible to alter the frequency of the resonant circuit by substituting one pair of coil parts for the other. The switches 53 to 56 are controlled by a control circuit 57 which is provided with synchronization from the crystal controlled oscillator 41.

Figure 7A:
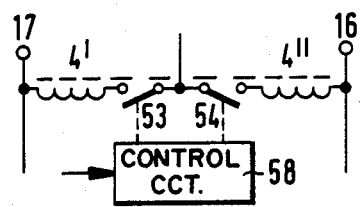

In FIG. 7a the coil parts 4' and 4" can be switched out of circuit by the switches 53 and 54, with the result that the generation of shift clocking signals is interrupted. In this way, the advance of the video signal in the shift register 10 is halted. As soon as the switches 53 and 54 are closed, the shift clocking signal is again generated and the advnace of the video signal through the shift register begins again. A control circuit 58 synchonized by the crystal controlled oscillator 41 for control of the switches 53 and 54 is provided by which the switches can be opened only exactly at the voltage maximum or minimum of the shift clock signal amplitude. This arrangement can also be utilized for time transformation if the shift clock signal is halted for a certain lapse of time, for example, following completion of writing a video signal into the shift register.

Figure 7B:
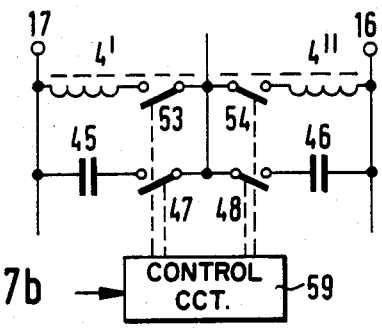

In FIG. 7b, the circuit of FIG. 7a is supplemented by a parallel branch containing the capacitors 45 and 46 which can be switched in and out by the switches 47 and 48. In this example it is possible to provide both a frequency change for the shift clock signal and a timed interruption of a kind described with reference to FIG. 7a. The control of the switches 47, 48, 53 and 54 is performed by a control circuit 59 which as in the case of other switch control circuits mentioned above, is synchronized by a crystal controlled oscillator. Of course, such a manner of operation is also possible for a circuit according to FIG. 6b if all of the switches are opened for interrupting the generation of shift clock signals and frequency switching is provided by operating only two series-connected switches.

Although the invention has been described with reference to particular illustrative examples, it will be recognized that a variety of variations and modifications are possible within the inventive concept.

When frequency switching and crystal control are used simultaneously some switching is also necessary in the crystal-controlled frequency source too.

A video signal as put into an analog shift register is, of course, composed of analog signal samples, at some sampling frequency.

We claim:

1. Shift-clocking drive circuit for analog signal sample cells of a signal sample progressive-shift device equipped with shift clocking inputs having respective input reactances, said circuit comprising:

shift clocking inputs alternatively activatable respectively by oppositely polarized peaks of said shift-clocking waves and having capacitances as said input reactances of said shift clocking inputs, which capacitances have an accessible common connection;

resonant circuit means comprising a coil connected between said shift clocking inputs for resonating with the series combination of said input capacitances resulting from said common connection and thereby resonating at a shift clocking frequency with said input reactances and for thereby sinusoidally shaping shift-clocking electric waves applied to said shift clocking inputs;

a generator of waves of said shift clocking frequency coupled with said resonant circuit means for delivering electrical energy for maintaining a predetermined amplitude of said shift-clocking waves.

2. Shift-clocking drive circuit according to claim 1 in which said coi is a center-tapped coil, having its center tap connected to said common connection of said input capacitances.

3. Shift-clocking drive circuit according to claim 2, wherein said wave generator is coupled with said resonant circuit means for delivering electrical energy in an amount sufficient to overcome damping of said shift-clocking waves.

4. Shift-clocking drive circuit in accordance with claim 2, wherein said wave generator includes a free-running oscillator connected for delivering a pulse of energy to said resonant circuit means once per cycle of oscillation.

5. Shift-clocking drive circuit according to claim 2, in which said wave generator comprises a free-running push-pull oscillator connected for delivering pulses of opposite polarity to said resonant circuit means in each cycle of said shift clocking waves.

6. Shift-clocking drive circuit in accordance with claim 2, wherein said wave generator includes means for quartz crystal control of the frequency of said wave generator.

7. Shift-clocking drive circuit according to claim 2, in which means are provided for changing the frequency of said resonant circuit by switching reactive components into or out of said resonant circuit, said reactive components comprising at least one supplementary capacitance.

8. Shift-clocking drive circuit according to claim 2, in which means are provided for changing the frequency of said resonant circuit by switching a supplementary coil into or out of parallel connection with said coil connected between said shift clocking inputs.

9. Shift-clocking drive circuit according to claim 2, in which means are provided for interrupting said shift clocking electric waves applied to said shift clocking inputs during timed intervals, said interrupting means comprising electronic switch means for interrupting the connection between said center tap and portions of said coil which are normally connected to said center tap and control means for opening said switch means only at the time of the signal peaks of said shift clocking electric waves.

10. Shift-clocking drive circuit according to claim 9, in which means are provided for frequency change of said resonant circuit by switching supplementary capacitance into or out of parallel connection with said input capacitances by means of switches for respectively connecting one pole of each of said supplementary capacitances to said center tap connection for said coil and control means for said last-mentioned switches for opening and closing said last-mentioned switches for alteration of resonant circuit frequency only during signal peaks of said shift-clocking electric waves.

* * * * *